(12) United States Patent
Mizokawa et al.

(10) Patent No.: US 9,230,844 B2
(45) Date of Patent: Jan. 5, 2016

(54) CARRIER TRANSFER FACILITATING DEVICE

(75) Inventors: Takumi Mizokawa, Osaka (JP);
Mitsutoshi Ochiai, Toyohashi (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 751 days.

(21) Appl. No.: 13/447,503

(22) Filed: Apr. 16, 2012

(65) Prior Publication Data

US 2012/0263562 A1    Oct. 18, 2012

Related U.S. Application Data

(63) Continuation of application No. PCT/JP2010/068051, filed on Oct. 14, 2010.

(30) Foreign Application Priority Data

Oct. 14, 2009    (JP) .................................. 2009-237751

(51) Int. Cl.
*H01L 21/677* (2006.01)
*H01L 21/687* (2006.01)

(52) U.S. Cl.
CPC .... *H01L 21/67769* (2013.01); *H01L 21/67733* (2013.01); *H01L 21/67736* (2013.01); *H01L 21/68707* (2013.01); *Y10S 414/14* (2013.01)

(58) Field of Classification Search
CPC ..................... H01L 21/6773; H01L 21/67733; H01L 21/67763; H01L 21/67769; H01L 21/67775; Y10S 414/14
USPC .................................................. 414/626, 940
See application file for complete search history.

(56) References Cited

U.S. PATENT DOCUMENTS

| 5,570,990 | A  | * | 11/1996 | Bonora et al. | ................. | 414/543 |
| 7,413,396 | B2 | * | 8/2008  | Ito           | .................. | 414/626 |
| 7,578,650 | B2 | * | 8/2009  | Aalund et al. | ................. | 414/806 |

(Continued)

FOREIGN PATENT DOCUMENTS

| JP | 2008-508731 A | 3/2008 |
| JP | 2008-244416 A | 10/2008 |
| JP | 2008-258192 A | 10/2008 |

OTHER PUBLICATIONS

Office Action issued Jan. 14, 2015 in Taiwan Application Serial No. 099135072.

*Primary Examiner* — James Keenan
(74) *Attorney, Agent, or Firm* — Oblon, McClelland, Maier & Neustadt, L.L.P

(57) ABSTRACT

A carrier transfer facilitating device does not require, for example, renewal (replacement) of an existing load port. Specifically, a carrier transfer facilitating device is provided for a load port on which a FOUP is placed. The carrier transfer facilitating device includes a temporary table on which the FOUP is temporarily placed, a carrier transferring carriage that travels above a carrier table of the load port and the temporary table in the horizontal direction and that lifts and transfers the FOUP between the carrier table and the temporary table, a supporting member that supports the temporary table and the carrier transferring carriage, and a controller that controls the movement of the carrier transferring carriage so as to avoid contact of the carrier transferring carriage with the FOUP while the FOUP is transferred between the hoop supporting table or the temporary table and an OHT.

12 Claims, 9 Drawing Sheets

(56) References Cited

U.S. PATENT DOCUMENTS

| | | | |
|---|---|---|---|
| 7,891,929 B2* | 2/2011 | Yamamoto et al. | 414/281 |
| 8,043,039 B2* | 10/2011 | Yamamoto et al. | 414/217 |
| 8,348,584 B2* | 1/2013 | Mizokawa et al. | 414/225.01 |
| 2003/0044268 A1 | 3/2003 | Bonora et al. | |
| 2004/0118980 A1* | 6/2004 | Chang et al. | 246/1 C |
| 2006/0257233 A1* | 11/2006 | Bonora et al. | 414/217 |
| 2008/0014061 A1* | 1/2008 | Izumi | 414/281 |
| 2008/0236755 A1* | 10/2008 | Kondoh et al. | 156/345.51 |
| 2009/0060697 A1* | 3/2009 | Wakabayashi | 414/564 |
| 2010/0003111 A1* | 1/2010 | Yeo et al. | 414/222.07 |
| 2010/0047045 A1* | 2/2010 | Park et al. | 414/222.07 |
| 2012/0275886 A1* | 11/2012 | Ota | H01L 21/67733 414/222.08 |

* cited by examiner

CARRIER TRANSFER FACILITATING DEVICE

CROSS-REFERENCE TO RELATED APPLICATION

This application is a continuation application of International Application No. PCT/JP2010/068051, filed on Oct. 14, 2010, the entire contents of which is incorporated herein by reference. PCT/JP2010/068051 claims priority to JP 2009-237751, filed on Oct. 14, 2009, the content of which is also incorporated herein by reference.

TECHNICAL FIELD

The present invention relates to a carrier transfer facilitating device for reducing the waiting time for transportation of a carrier to a load port.

BACKGROUND ART

A transporting system relating to this kind of technique is described in Patent Document 1, for example. The transporting system described in Patent Document 1 includes a load port, a relay unit located adjacent to the load port, and a carrier transferring device incorporated in the load port and the relay unit. The carrier transferring device has a carrier moving device and a carrier lifting device set below a carrier table of the load port and the relay unit. The transportation of a carrier to the load port (load ports) is performed by a transporting vehicle such as an OHT (Overhead Hoist Transfer). According to this transporting system, the placement of the carrier and the picking of the carrier can be attained by one pass of the OHT. Accordingly, the waiting time for transportation of the carrier can be reduced without adopting a device having a plurality of load ports the number of which is large.

PRIOR ART DOCUMENT

Patent Document

Patent Document 1: Japanese Patent Laid-open No. 2008-244416

SUMMARY OF INVENTION

Technical Problem

In the transporting system described in Patent Document 1, however, the carrier transferring device is incorporated in the load port and the relay unit itself (inside the unit). Accordingly, in the case of applying this transporting system to an existing load port (load port not including a carrier transferring device), the existing load port cannot be used as it is. In other words, it is necessary to modify the existing load port or renew (replace) the existing load port as a unit.

It is accordingly an object of the present invention to provide a carrier transfer facilitating device which can eliminate the need for renewal (replacement) of an existing load port.

Technical Solution

In accordance with the present invention, there is provided a carrier transfer facilitating device adapted to be provided for a load port having a carrier table to place thereon a carrier to be transported by a carrier transporting mechanism, the device including: a temporary table to temporarily place the carrier thereon; a carrier transferring carriage configured to transfer the carrier between the carrier table and the temporary table, the carrier transferring carriage traveling in a horizontal direction above the carrier table and the temporary table, and lifting up and down the carrier from and onto the temporary table and the carrier table; a supporting member configured to support the temporary table and the carrier transferring carriage; and a carriage controller configured to control the carrier transferring carriage such that a position of the carrier transferring carriage does not interfere with the carrier when the carrier is transferred between the carrier table or the temporary table and the carrier transporting mechanism.

In the present invention, the carrier transferring carriage is horizontally moved above the carrier table of the load port to transfer the carrier between the carrier table of the load port and the temporary table. Further, the temporary table and the carrier transferring carriage are supported to the supporting member. Further, in transferring the carrier between the carrier table of the load port or the temporary table and the carrier transporting means, the carriage control portion controls the operation of the carrier transferring carriage so as to avoid the contact of the carrier transferring carriage and the carrier.

Accordingly, the transfer of the carrier can be performed by using the space above the carrier table of the load port. As a result, a carrier transferring device as in the prior art need not be incorporated in the load port itself (inside the load port), but the carrier transfer facilitating device (carrier transferring device) can be retrofitted (subsequently added to an existing load port). That is, an existing load port can be used as it is.

Preferably, the carrier transporting means includes transporting means adapted to travel above the carrier transferring carriage; and the carriage control portion retracts the carrier transferring carriage to a position not above the carrier table or the temporary table in transferring the carrier between the carrier table or the temporary table and the carrier transporting means. More preferably, the position of retraction of the carrier transferring carriage is set to a position where the next operation can be performed immediately.

With this configuration, both the carrier transferring carriage and the carrier transporting means travel above the carrier table of the load port. Accordingly, the space above the carrier table can be used more effectively, so that the space for the carrier transporting system as a whole can be saved.

Preferably, the carrier transporting means includes transporting means for transporting the carrier in one direction; the temporary table is located on the downstream side of the carrier table in a transporting direction of the carrier; and the carriage control portion immediately transfers the processed carrier from the carrier table to the temporary table when processing of the carrier is completed.

With this configuration, the time of leaving the processed carrier on the carrier table of the load port can be reduced. As a result, the waiting time for transportation of the carrier to the load port can be further reduced.

Preferably, the bottom surface level of the carrier lifted by the carrier transferring carriage is set higher than the upper surface level of the carrier placed on the carrier table and the temporary table.

With this configuration, the carrier can be horizontally moved above another carrier placed on the carrier table of another load port or the temporary table. As a result, even when a plurality of existing load ports are arranged adjacent to each other, the carrier can be transferred between any one of all the load ports and the temporary table, so that the waiting time for transportation of the carrier to each load port can be further reduced.

Preferably, the load port and the temporary table are arranged adjacent to each other; and the bottom surface level of the carrier lifted by the carrier transferring carriage is set lower than the upper surface level of the carrier placed on the carrier table or the temporary table.

With this configuration, the height where the carrier transferring carriage travels can be reduced to a minimum. As a result, the height of the carrier transfer facilitating device as a whole can be reduced, so that the carrier transfer facilitating device can be made compact. Further, since the lift amount of the carrier is small, the operation time of the carrier transferring carriage can be reduced, resulting in a further reduction in the waiting time for transportation of the carrier to the load port.

Preferably, the supporting member includes a traveling rail extending in a horizontal direction and having an upper surface on which the carrier transferring carriage travels; at least two leg members extending downward from the traveling rail; and a caster mounted at the lower end of each leg member.

With this configuration, the carrier transfer facilitating device can be made traveling and freestanding, so that it can be applied to an existing load port more easily. As a result, the operation time for setting of the carrier transfer facilitating device can be reduced to thereby reduce the suspension time of existing equipment in a factory. Further, relocation to another processing device (relocation of the carrier transfer facilitating device) can also be made more easily.

Advantageous Effects

According to the present invention, the carrier can be transferred by using the space above the carrier table of the load port, so that the carrier transfer facilitating device (carrier transferring device) can be retrofitted. Accordingly, it is possible to provide a carrier transfer facilitating device which can eliminate the need for renewal (replacement) of an existing load port. Further, since relocation to another processing device (relocation of the carrier transfer facilitating device) can also be made, the extensibility is excellent.

MODES FOR CARRYING OUT THE INVENTION

Modes for carrying out the present invention will now be described with reference to the drawings.

(Carrier Transporting System)

Figure 1:
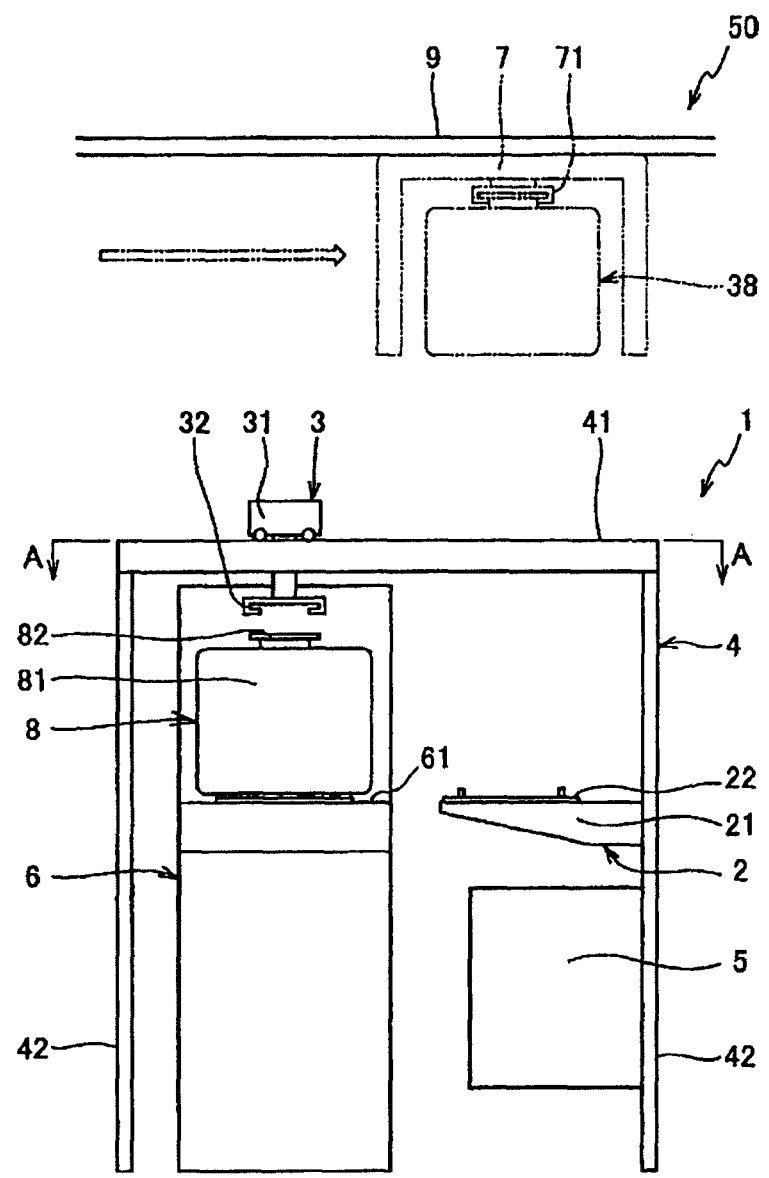
FIG. 1 is a schematic elevational view showing a carrier transfer facilitating device according to a first preferred embodiment of the present invention.
Figure 2:
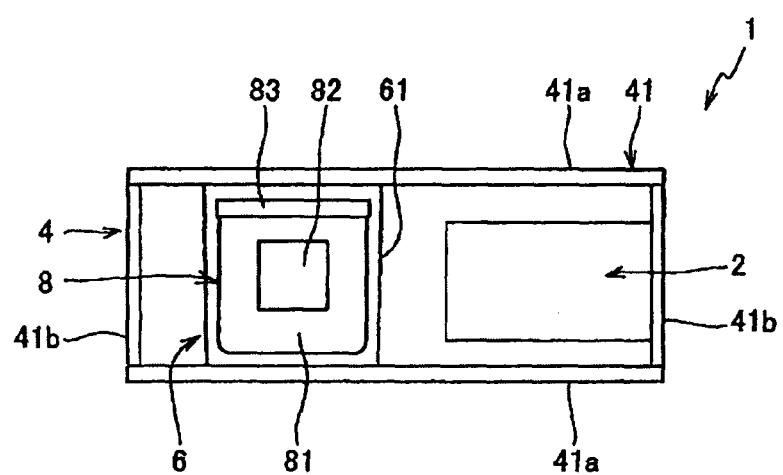
FIG. 2 is a schematic plan view (view taken along the line A-A in FIG. 1) of the carrier transfer facilitating device shown in FIG. 1.

The configuration of a carrier transporting system 50 and a carrier transfer facilitating device 1 will now be described with reference to FIGS. 1 and 2. As shown in FIG. 1, the carrier transporting system 50 includes an OHT 7 (Overhead Hoist Transfer) traveling on the ceiling side in a factory, a rail 9 (track) along which the OHT 7 travels, a load port 6 located below the rail 9, and the carrier transfer facilitating device 1 provided for the load port 6.

(OHT)

The OHT 7 is carrier transporting means (carrier transporting vehicle) traveling above a carrier transferring carriage 3 which will be hereinafter described, and has a hoist portion 71 adapted to be vertically moved by belt drive. The hoist portion 71 of the OHT 7 functions to hoist a FOUP 38 (8) (Front Opening Unified Pod) and transport the FOUP 38 (8) in one direction. The FOUP is an example of the carrier.

The carrier transporting means may be provided by an OHS (Overhead Shuttle), RGV (Rail Guided Vehicle), or AGV (Automated Guided Vehicle) rather than the OHT 7. The RGV and AGV are carrier transporting means traveling on the floor side in a factory.

The FOUP 38 (8) has a body 81 and a flange portion 82 mounted on the upper surface of the body 81. For example, a plurality of semiconductor substrates are stored in the body 81. The flange portion 82 of the FOUP 38 (8) is adapted to be caught by the OHT 7. The FOUP 38 (8) corresponds to the carrier in the present invention. However, the carrier is not limited to the FOUP 38 (8).

(Rail (Track))

The rail 9 is located so as to be hung from the ceiling of the factory. In the case that the carrier transporting means is an RGV, the rail (track) is located on the floor or the like of the factory.

(Load Port)

The load port 6 is a device for opening/closing a lid 83 (see FIG. 2) of the FOUP 8 placed on a carrier table 61. The carrier table 61 is provided on the front side of the load port 6. A processing device (not shown) for processing the semiconductor substrates, for example, is located on the rear side of the load port 6.

Carrier Transfer Facilitating Device According to First Preferred Embodiment

The carrier transfer facilitating device 1 includes a temporary table 2, a carrier transferring carriage 3, a supporting member 4 for supporting the temporary table 2 and the carrier transferring carriage 3, and a controller 5 (carriage control portion) for controlling the operation of the carrier transferring carriage 3.

(Temporary Table)

The temporary table 2 is a table on which the FOUP 8 is temporarily placed. The temporary table 2 includes brackets 21 mounted on the side surfaces of leg members 42 constituting the supporting member 4 and a platelike member 22 fixed to the upper surfaces of the brackets 21. In this preferred embodiment, the temporary table 2 is located on the downstream side of the carrier table 61 (the load port 6) in the direction of transportation of the FOUP 8.

(Carrier Transferring Carriage)

The carrier transferring carriage 3 functions to transfer the FOUP 8 between the carrier table 61 and the temporary table 2 so as to travel above the carrier table 61 and the temporary table 2 in a horizontal direction and lift the FOUP 8.

The carrier transferring carriage 3 includes a carriage body 31 having wheels and a lift device 32 mounted on the carriage body 31. The lift device 32 is of a belt drive type, for example. The carriage body 31 is adapted to travel above the carrier table 61 of the load port 6 and the temporary table 2 in a horizontal direction, and the lift device 32 functions to vertically move the FOUP 8. A plurality of carrier transferring carriages may be provided in place of the single carrier transferring carriage 3.

(Supporting Member)

The supporting member 4 includes a traveling rail 41 extending in a horizontal direction and having an upper surface on which the carrier transferring carriage 3 travels and four leg members 42 extending vertically downward from the opposite ends of the traveling rail 41. As shown in FIG. 2, the traveling rail 41 is composed of two rail members 41a extending parallel to each other and two connecting members 41b connecting the rail members 41a at their opposite ends. The space between the two rail members 41a is set so that the FOUP 8 to be passed between the rail members 41a does not interfere with the rail members 41a in lifting or lowering the FOUP 8. Further, the connecting members 41b are positioned not above the FOUP 8 so that the FOUP 8 does not come into contact with the connecting members 41b in lifting or lowering the FOUP 8.

In this preferred embodiment, the four leg members 42 of the supporting member 4 are set on the floor surface in the factory and kept in noncontact with the load port 6. However, brackets (not shown, but constitute members of the supporting member) may be mounted on the load port 6 and the supporting member may be supported through the brackets to the load port 6. Further, the rail member 41a on the side of the processing device may be mounted on the processing device.

(Controller)

The controller 5 includes a carriage control portion for controlling the operation of the carrier transferring carriage 3 so as to avoid the contact of the carrier transferring carriage 3 and the FOUP 8 in transferring the FOUP 8 between the carrier table 61 or the temporary table 2 and the OHT 7. For example, the carriage control portion is provided by a program portion of a microcomputer incorporated in the controller. The controller 5 is located in the space below the temporary table 2 and mounted on the side surfaces of the leg members 42 of the supporting member 4.

(Operation of Carrier Transfer Facilitating Device)

There will now be described a flow of transportation of the FOUP 8 by the use of the carrier transfer facilitating device 1 and the control of the carrier transferring carriage 3 by the controller 5 (control device having the carriage control portion) with reference to FIGS. 3 to 6. The operation of the carrier transferring carriage 3 to be described later is realized by the carriage control portion incorporated in the controller 5.

(Retraction of Carrier Transferring Carriage)

Prior to placing the FOUP 8 on the carrier table 61 of the load port 6 by using the OHT 7, the controller 5 sends a signal to the carrier transferring carriage 3 to retract it to a position not above the carrier table 61 (step (1)). In this preferred embodiment, the carrier transferring carriage 3 is retracted to a position above the temporary table 2.

Figure 3:
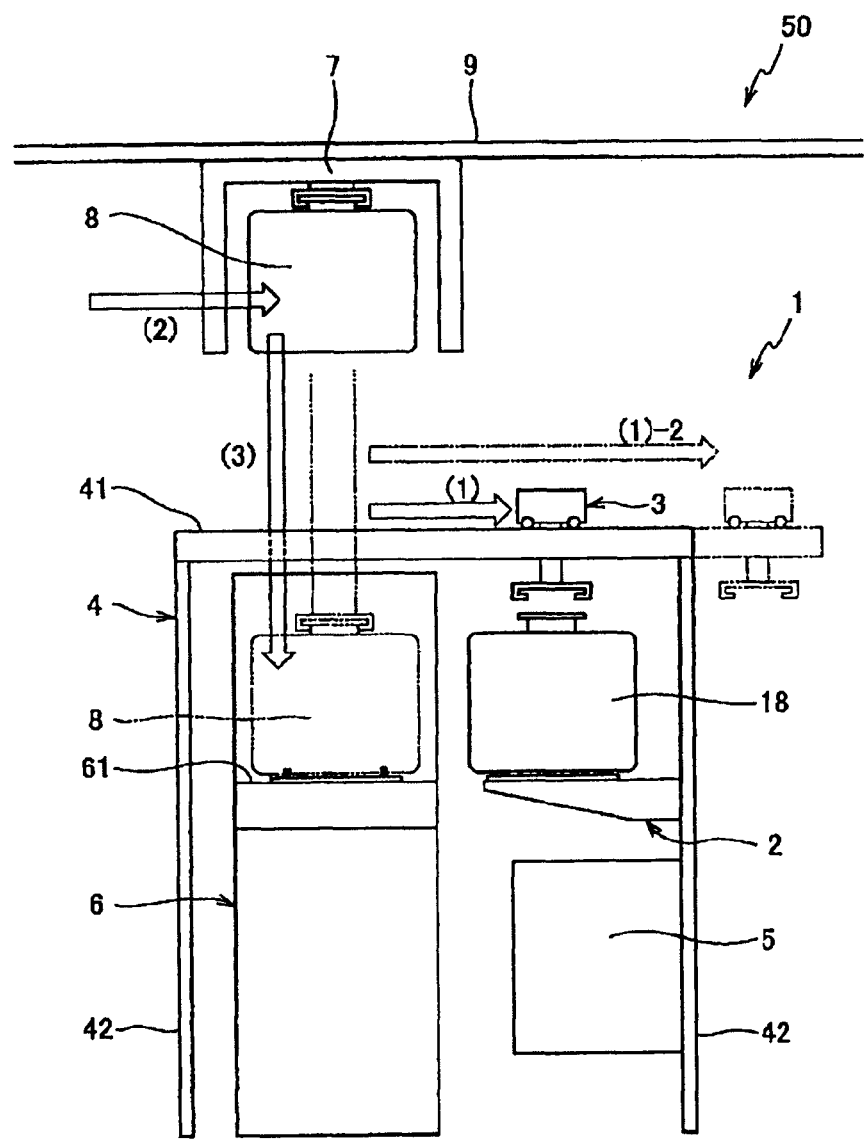
FIG. 3 is a view showing a flow of transportation of a FOUP.

As a modification, the traveling rail 41 may be extended to the downstream side of the temporary table 2 in the carrier transporting direction as shown by a phantom line (double dot & dash line) in FIG. 3. In this case, the carrier transferring carriage 3 may be retracted to a position not above the temporary table 2 on the downstream side thereof (step (1)-2). With this configuration, the transfer of the FOUP between the temporary table 2 and another OHT is not hindered by the carrier transferring carriage 3.

When the carrier transferring carriage 3 is retracted from the position above the carrier table 61 of the load port 6 before placing the FOUP 8 on the carrier table 61 by using the OHT 7 as described above, the controller 5 recognizes this condition where the carrier transferring carriage 3 is absent at the position above the carrier table 61.

(Placement of FOUP by OHT)

The OHT 7 holding the FOUP 8 travels to the position above the carrier table 61 of the load port 6 (step (2)). When the OHT 7 reaches the position above the carrier table 61 of the load port 6, the OHT 7 lowers the FOUP 8 to the carrier table 61 (step (3)).

(Picking of Another FOUP by OHT)

Figure 4:
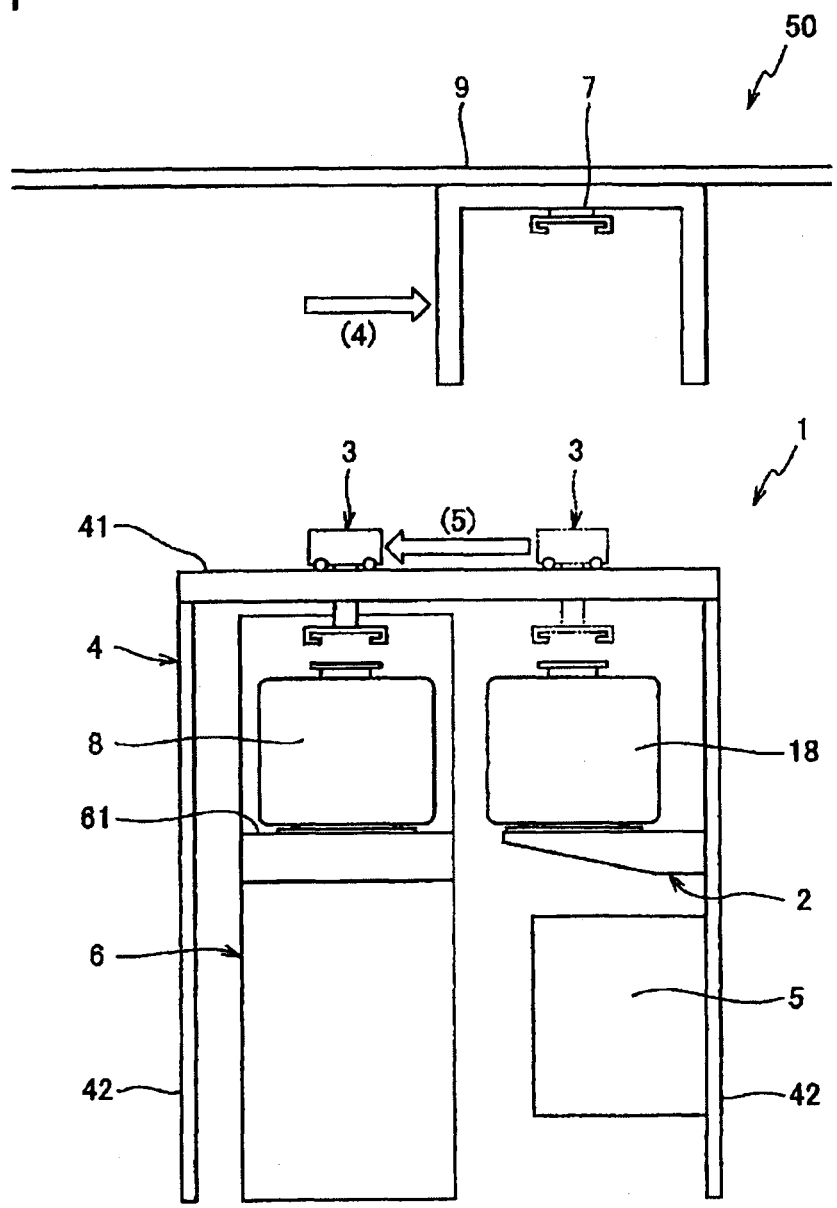
FIG. 4 is a view showing the flow whose steps are subsequent to the steps shown in FIG. 3.

As shown in FIG. 4, the OHT 7 starts to travel to the position above the temporary table 2 after lifting the hoist portion 71 (step (4)). On the conditions that the OHT 7 has started traveling and the hoist portion 71 is absent in the traveling space for the carrier transferring carriage 3 above the carrier table 61, the carrier transferring carriage 3 is controlled by the controller 5 and moved from the position above the temporary table 2 to the position above the carrier table 61 (step (5)).

As shown in FIG. 4, a processed FOUP 18 storing semiconductor substrates processed by the processing deice (not shown) located on the rear side of the load port 6 is temporarily placed on the temporary table 2 (this FOUP 18 has already been transferred from the carrier table 61 to the temporary table 2 by the carrier transferring carriage 3).

Figure 5:
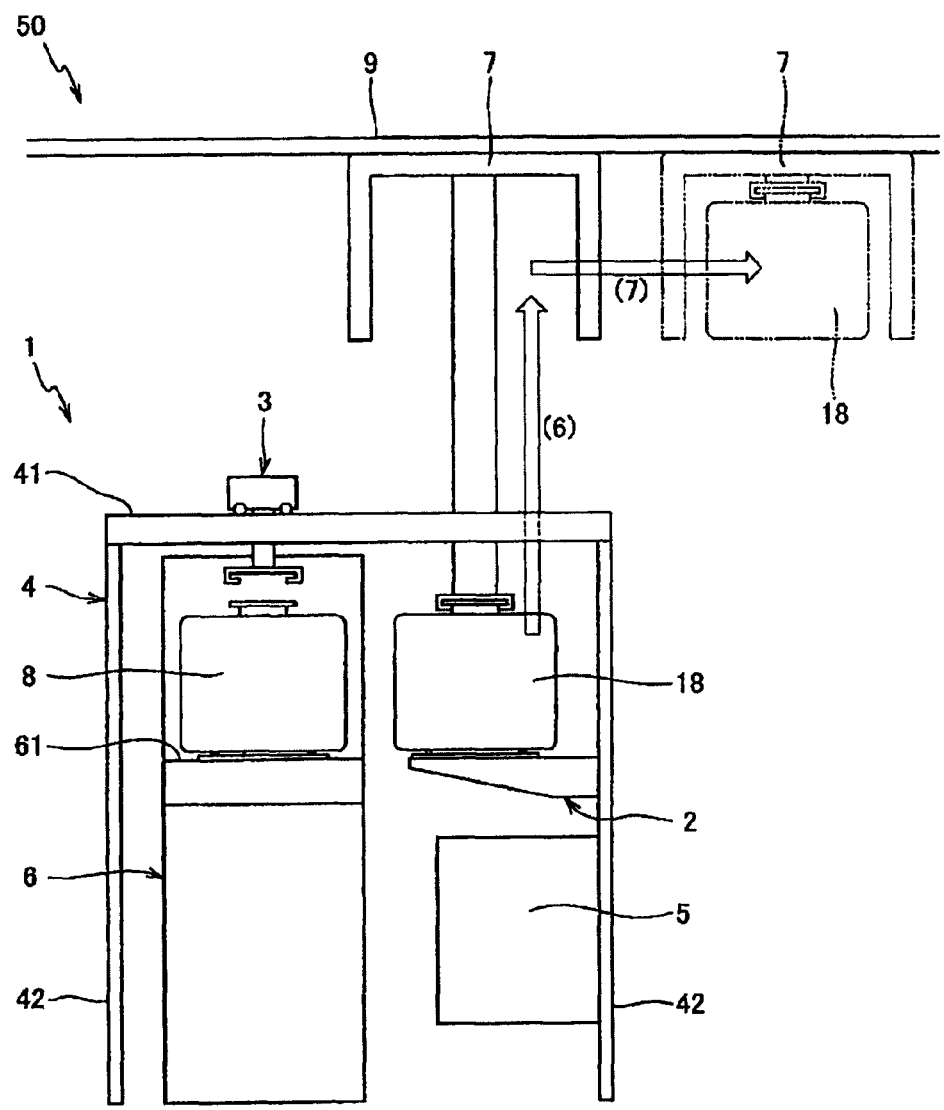
FIG. 5 is a view showing the flow whose steps are subsequent to the steps shown in FIG. 4.

When the empty OHT 7 not holding the FOUP 8 reaches the position above the temporary table 2 as shown in FIG. 5, the OHT 7 lifts the processed FOUP 18 from the temporary table 2 (step (6)). Thereafter, the OHT 7 transports the FOUP 18 to a predetermined position (step (7)).

According to the transporting system 50, the placement of the FOUP 8 (step (3)) and the picking of the FOUP 18 (step (6)) (place & pick) can be attained by the one-way transportation by the OHT 7. Accordingly, the waiting time for transportation of the FOUP can be reduced without adopting a device having a plurality of load ports the number of which is large. In other words, the transport efficiency of the carrier transporting system 50 can be improved.

(Transfer of FOUP by Carrier Transferring Carriage)

When the carrier transferring carriage 3 reaches the position above the carrier table 61, the carrier transferring carriage 3 is controlled by the controller 5 to wait at the position above the carrier table 61 until the FOUP 8 placed on the carrier table 61 becomes a condition (processed FOUP 8) where the semiconductor substrates stored in the FOUP 8 have been processed by the processing device.

Figure 6:
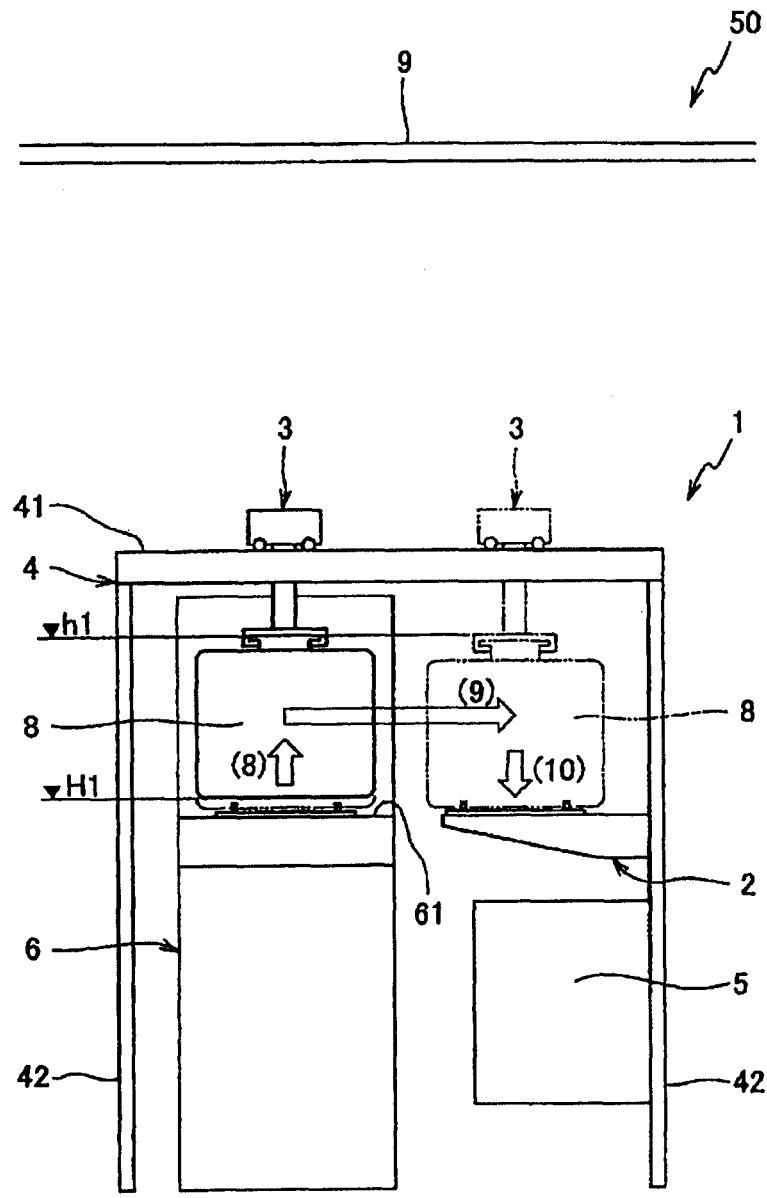
FIG. 6 is a view showing the flow whose steps are subsequent to the steps shown in FIG. 5.

When the processing of the FOUP 8 is completed, the controller 5 controls the carrier transferring carriage 3 to immediately transfer the processed FOUP 8 from the carrier table 61 to the temporary table 2. More specifically, when the FOUP 8 placed on the carrier table 61 becomes a condition where the semiconductor substrates processed are stored in the FOUP 8 as shown in FIG. 6, the carrier transferring carriage 3 immediately lifts the FOUP 8 from the carrier table 61 (step (8)), next horizontally moves the FOUP 8 to the position above the temporary table 2 (step (9)), and next lowers the FOUP 8 to the temporary table 2 (step (10)).

The temporary table 2 is located on the downstream side of the carrier table 61 (the load port 6) in the transport direction of the FOUP 8, and the above control is performed in this arrangement. Accordingly, the time of leaving the processed FOUP on the carrier table 61 of the load port 6 can be reduced. As a result, the waiting time for transportation of the FOUP to the load port 6 can be further reduced. The time when the processing of the FOUP 8 is completed means the time when the semiconductor substrates processed by the processing device are stored in the body 81 of the FOUP 8.

In this preferred embodiment, the bottom surface level H1 of the FOUP 8 (the body 81 of the FOUP 8) lifted by the carrier transferring carriage 3 is set lower than the upper surface level h1 of the FOUP 8 (the flange portion 82 of the FOUP 8) placed on the carrier table 61 and the temporary table 2.

There is a case that a plurality of load ports 6 (carrier tables 61) and a plurality of temporary tables 2 are provided. In this case, the wording that the bottom surface level H1 of the FOUP 8 lifted by the carrier transferring carriage 3 is set lower than the upper surface level h1 of the FOUP 8 placed on the carrier table 61 or the temporary table 2 means that the bottom surface level H1 is set lower than the highest one of the upper surface levels h1 of the FOUP 8 placed on the plural carrier tables 61 and the plural temporary tables 2.

The bottom surface level H1 of the FOUP 8 lifted by the carrier transferring carriage 3 is determined by the installation level of the traveling rail 41, the lift amount of the lift device 32 of the carrier transferring carriage 3, etc.

While the upper surface level of the carrier table 61 is equal to the upper surface level of the temporary table 2 in this preferred embodiment, the upper surface level of the carrier table 61 may be different from the upper surface level of the temporary table 2.

As shown in FIG. 6, the lift height of the FOUP 8 from the carrier table 61 (or the temporary table 2) (the distance between the upper surface of the carrier table 61 (or the temporary table 2) and the bottom surface of the FOUP 8 lifted by the carrier transferring carriage 3) is preferably set very small.

According to the carrier transfer facilitating device 1 as described above, the transfer of the FOUP 8 can be performed by using the space above the carrier table 61 of the load port 6. As a result, a carrier transferring device as in the prior art need not be incorporated in the load port itself (inside the load port), but the carrier transfer facilitating device (carrier transferring device) can be retrofitted. That is, an existing load port can be used as it is.

In the transporting system using the OHT performing one-way transportation as described in Patent Document 1, one load port and one relay unit are arranged adjacent to each other. The front side (the carrier placing side) of the load port and the relay unit is predetermined. Accordingly, such a set of transporting system (composed of one load port, one relay unit, and one carrier transferring device) has a mirror image in the lateral direction.

To the contrary, the carrier transfer facilitating device 1 can be retrofitted to an existing load port. That is, in the transporting system using the OHT performing one-way transportation, the temporary table 2 of the carrier transfer facilitating device 1 can be suitably located both on the upstream side and on the downstream side of an existing load port (easy transportation) and the mirror-image problem can be eliminated (excellent extensibility).

In this preferred embodiment, the FOUP 8 to be processed is first placed on the carrier table 61 of the load port 6 by the OHT 7, and the processed FOUP 8 is next transferred from the carrier table 61 to the temporary table 2 by the carrier transferring carriage 3. As a modification, the FOUP 8 to be processed may be first placed on the temporary table 2 by the OHT 7 and next transferred from the temporary table 2 to the carrier table 61 by the carrier transferring carriage 3.

In this case, prior to placing the FOUP 8 on the temporary table 2 by using the OHT 7, the controller 5 sends a signal to the carrier transferring carriage 3 to retract it to a position not above the temporary table 2 (e.g., the position above the carrier table 61 in this preferred embodiment). The FOUP 8 to be processed means the FOUP 8 storing semiconductor substrates to be processed.

In this preferred embodiment, the temporary table 2 is located on the downstream side of the carrier table 61 (the load port 6) in the transporting direction of the FOUP 8. As a modification, the temporary table 2 may be located on the upstream side of the carrier table 61 (the load port 6) in the transporting direction of the FOUP 8.

In this case, the FOUP 8 to be processed may be first placed on the temporary table 2 by the OHT 7 and next transferred from the temporary table 2 to the carrier table 61 by the carrier transferring carriage 3. As a modification, the FOUP 8 to be processed may be first placed on the carrier table 61 of the load port 6, and the processed FOUP 8 may be next transferred from the carrier table 61 to the temporary table 2 by the carrier transferring carriage 3.

In any case, during the transfer of the FOUP between the carrier table 61 or the temporary table 2 and the OHT 7, the controller 5 controls the operation of the carrier transferring carriage 3 so as to retract the carrier transferring carriage 3 to a position not above the carrier table 61 or the temporary table 2, thereby avoiding the contact of the carrier transferring carriage 3 and the FOUP.

(Modification of Carrier Transfer Facilitating Device)

Figure 7:
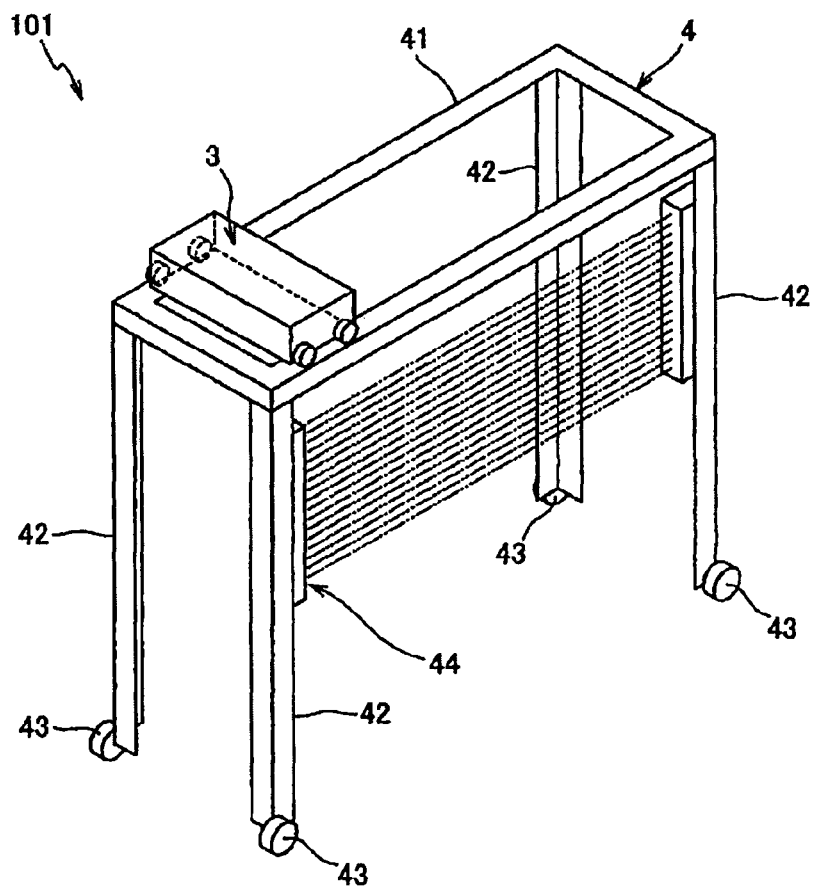
FIG. 7 is a schematic perspective view showing a modification of the carrier transfer facilitating device according to the first preferred embodiment.

A modification of the carrier transfer facilitating device 1 according to the first preferred embodiment will now be described with reference to FIG. 7. FIG. 7 shows a carrier transfer facilitating device 101 as a modification of the first preferred embodiment. The difference between the carrier transfer facilitating device 101 according to this modification and the carrier transfer facilitating device 1 according to the first preferred embodiment will be mainly described. In FIG. 7, the temporary table 2 and the controller 5 are not shown.

As shown in FIG. 7, the carrier transfer facilitating device 101 according to this modification further includes four casters 43 and an area sensor 44.

In this modification, the four casters 43 are respectively mounted at the lower ends of the four leg members 42. The area sensor 44 is mounted on the two leg members 42 opposed to each other in the transporting direction of the FOUP so as to be set with respect to the load port 6.

By mounting the casters 43 at the lower ends of the leg members 42, the carrier transfer facilitating device 101 can be made traveling and freestanding, so that it can be applied to an existing load port more easily. Further, the area sensor 44 can detect the entry of a worker into the inside space of the carrier transfer facilitating device 101 during the vertical movement of the FOUP by the OHT 7 and the horizontal movement of the FOUP by the carrier transferring carriage 3, thereby preventing any accident such as injury of the worker. Further, since the supporting member 4 has a cabinet structure, the area sensor 44 can be easily mounted. In the carrier transferring device described in Patent Document 1, it is difficult to mount an area sensor adapted to generate a beam from one end to the other end of the carrier transferring device.

Second Preferred Embodiment

A carrier transfer facilitating device 201 according to a second preferred embodiment will now be described with reference to FIG. 8. The difference between the carrier transfer facilitating device 201 according to the second preferred embodiment and the carrier transfer facilitating device 1 according to the first preferred embodiment will be mainly described.

Figure 8:
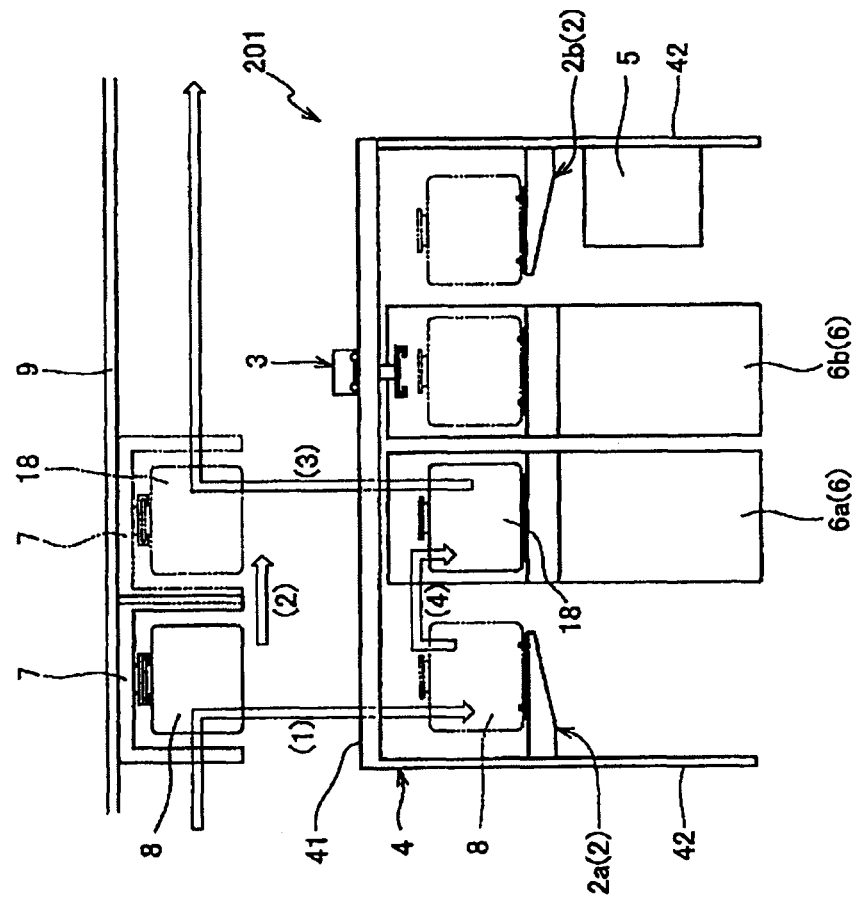
FIG. 8 is a schematic elevational view showing a carrier transfer facilitating device according to a second preferred embodiment of the present invention.

As shown in FIG. 8, the carrier transfer facilitating device 201 according to the second preferred embodiment includes two temporary tables 2a and 2b provided on the opposite sides of two adjacent load ports 6a and 6b. The temporary tales 2a and 2b are arranged adjacent to the load ports 6a and 6b, respectively. As similar to the carrier transfer facilitating device 1 according to the first preferred embodiment, the bottom surface level of the FOUP 8 (the body of the FOUP 8) lifted by the carrier transferring carriage 3 is set lower than the upper surface level of the FOUP 8 (the flange portion of the FOUP 8) placed on the carrier table of each load port 6 or each temporary table 2.

There will now be described a flow of transportation of the FOUP 8 by the use of the carrier transfer facilitating device 201.

The FOUP 8 to be processed is first placed on the temporary table 2a by the OHT 7 (step (1)), and the OHT 7 is next moved to the downstream side in the FOUP transporting direction (step (2)) (more specifically, the OHT 7 is moved to a position above the carrier table of the load port 6a located adjacent to the temporary table 2a on the downstream side in the FOUP transporting direction). At this time, another FOUP 18 to be processed has already been placed on the carrier table of the load port 6a.

Prior to placing the FOUP 8 on the temporary table 2a by using the OHT 7, the controller 5 sends a signal to the carrier transferring carriage 3 to retract it to a position not above the temporary table 2a. In this preferred embodiment, the carrier transferring carriage 3 is retracted to the position above the carrier table of the load port 6b.

When the OHT 7 is moved to the position above the carrier table of the load port 6a, the OHT 7 lifts the FOUP 18 (processed condition) from the carrier table of the load port 6a and next transports the FOUP 18 to a predetermined position (step (3)). Also in this preferred embodiment, the placement of the FOUP 8 (step (1)) and the picking of the FOUP 18 (step (3)) can be attained by the one-way transportation by the OHT 7. Accordingly, the waiting time for transportation of the FOUP can be reduced without adopting a device having a large number of load ports (similar effects can be obtained in a third preferred embodiment to be hereinafter described).

Thereafter, the controller 5 controls the carrier transferring carriage 3 to transfer the FOUP 8 to be processed from the temporary table 2a to the carrier table of the load port 6a (step (4)), thus performing the transfer of the FOUP 8 by the use of the carrier transferring carriage 3.

According to the carrier transfer facilitating device 201, the height where the carrier transferring carriage 3 travels (i.e., the height of the traveling rail 41) can be suppressed. As a result, the height of the carrier transfer facilitating device 201 can be suppressed as a whole, so that the carrier transfer facilitating device 201 can be made compact. Further, since the lift amount of the FOUP is small, the operation time of the carrier transferring carriage 3 can be reduced, resulting in a further reduction in the waiting time for transportation of the FOUP to each load port 6.

Third Preferred Embodiment

A carrier transfer facilitating device 301 according to a third preferred embodiment will now be described with reference to FIG. 9. The difference between the carrier transfer facilitating device 301 according to the third preferred embodiment and the carrier transfer facilitating device 1 according to the first preferred embodiment will be mainly described.

Figure 9:
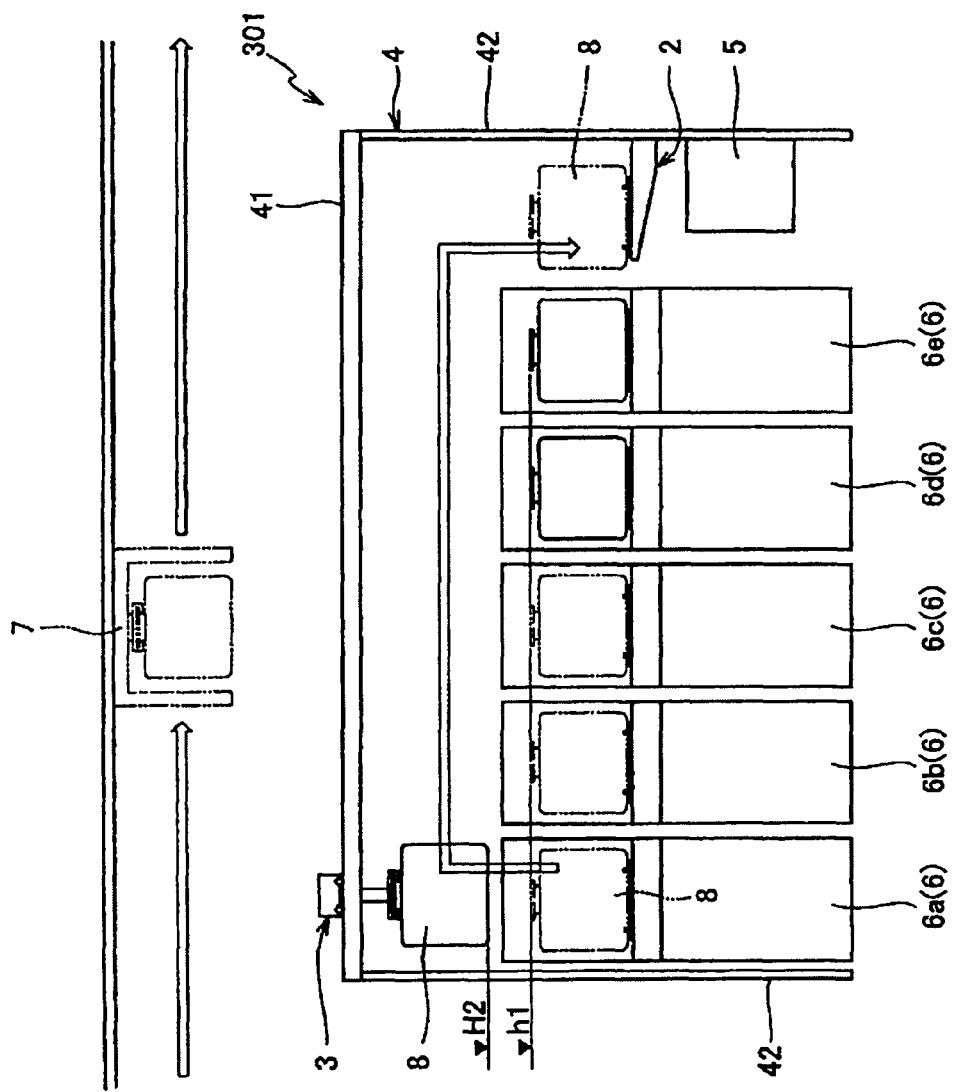
FIG. 9 is a schematic elevational view showing a carrier transfer facilitating device according to a third preferred embodiment of the present invention.

As shown in FIG. 9, the carrier transfer facilitating device 301 according to the third preferred embodiment is so configured as to enclose a plurality of (e.g., five as shown) load ports 6a to 6e arranged adjacent to each other. The carrier transfer facilitating device 301 includes a single temporary table 2 for temporarily placing the FOUP 8, and this temporary table 2 is located adjacent to the most downstream load port 6e on the downstream side thereof.

The temporary table 2 may be located between any adjacent ones of the load ports 6a to 6e (i.e., the temporary table may be interposed between the load ports). Further, the temporary table 2 may be located adjacent to the most upstream load port 6a on the upstream side thereof.

The difference between the carrier transfer facilitating device 1 according to the first preferred embodiment and the carrier transfer facilitating device 301 according to the third preferred embodiment includes not only the difference in length of the traveling rail 41 due to the difference in number of load ports, but also the difference in lift height of the FOUP 8 by the carrier transferring carriage 3. In this preferred embodiment, the bottom surface level H2 of the FOUP 8 (the body 81 of the FOUP 8) lifted by the carrier transferring carriage 3 is set higher than the upper surface level h1 of the FOUP 8 (the flange portion 82 of the FOUP 8) placed on the carrier table of each load port 6 or the temporary table 2.

The wording that the bottom surface level H2 of the FOUP 8 lifted by the carrier transferring carriage 3 is set higher than the upper surface level h1 of the FOUP 8 placed on the carrier table of each load port 6 or the temporary table 2 means that the bottom surface level H2 is set higher than the highest one of the upper surface levels h1 of the foups 8 placed on the carrier tables of the load ports 6a to 6e and the temporary table 2. In this preferred embodiment, the upper surface level of the carrier table of each of the load ports 6a to 6e is equal to the upper surface level of the temporary table 2.

The bottom surface level H2 of the FOUP 8 lifted by the carrier transferring carriage 3 is determined by the installation level of the traveling rail 41, the lift amount of the lift device 32 of the carrier transferring carriage 3, etc.

According to the carrier transfer facilitating device 301, the FOUP 8 can be horizontally moved above the other foups placed on the carrier tables of the load ports 6. As a result, even when a plurality of existing load ports are arranged adjacent to each other, the carrier can be transferred between any one of all the load ports and the temporary table, so that the waiting time for transportation of the carrier to each load port can be further reduced. Further, in the carrier transfer facilitating device 301, the bottom surface level H2 of the FOUP 8 lifted by the carrier transferring carriage 3 is set higher than the upper surface level h1 of the FOUP 8 placed on the carrier table or the temporary table 2, so that the device 301 can be easily applied to existing load ports arranged adjacent to each other.

While the specific preferred embodiments of the present invention have been described above, the present invention is not limited to these preferred embodiments, but various modifications and changes may be made within the scope of the present invention as hereinafter claimed.

EXPLANATION OF REFERENCE NUMERALS

1: Carrier transfer facilitating device
2: Temporary table
3: Carrier transferring carriage 4: Supporting member
5: Controller
6: Load port
7: OHT (carrier transporting means)
8: FOUP (carrier)
61: Carrier table

The invention claimed is:

1. A carrier transfer facilitating device adapted for a load port having a carrier table to place thereon a carrier to be transported by a carrier transporting mechanism that travels along a track, the device comprising:
   a temporary table to temporarily place the carrier thereon, the temporary table located directly below the track and without overlapping the carrier table in a vertical direction;
   a carrier transferring carriage configured to transfer the carrier between the carrier table and the temporary table, the carrier transferring carriage travelling in a horizontal direction above the carrier table and the temporary table, and lifting up and down the carrier from and onto the temporary table and the carrier table;
   a supporting member configured to support the temporary table and the carrier transferring carriage; and
   a carriage controller configured to control the carrier transferring carriage such that a position of the carrier transferring carriage does not interfere with the carrier when the carrier is transferred between the carrier table or the temporary table and the carrier transporting mechanism,
   wherein the carrier table is located directly below the track, and
   wherein a height of a bottom surface of the carrier is higher than an upper surface of the carrier transferring carriage when the carrier is held by the carrier transporting mechanism travelling on the track;
   wherein the carrier transferring carriage travels in a horizontal direction on a second track directly above the carrier table and the temporary table.

2. The carrier transfer facilitating device according to claim 1,
   wherein the carrier transporting mechanism is configured to travel above the carrier transferring carriage, and
   the carriage controller controls the carrier transferring carriage to move to a position not directly above the carrier table or the temporary table when the carrier is transferred between the carrier table or the temporary table and the carrier transporting mechanism.

3. The carrier transfer facilitating device according to claim 1,
   wherein the carrier transporting mechanism horizontally transports the carrier only in one direction,
   wherein the temporary table is located downstream of the carrier table with respect to the one direction of transporting the carrier, and
   wherein the carriage controller controls the carrier transferring carriage to transfer the carrier from the carrier table to the temporary table immediately after processing contents of the carrier is completed.

4. The carrier transfer facilitating device according to claim 1,
   wherein a height of a bottom surface of the carrier when lifted by the carrier transferring carriage is higher than a height of an upper surface of the carrier when placed on the carrier table or the temporary table.

5. The carrier transfer facilitating device according to claim 1,
   wherein the load port and the temporary table are arranged adjacent to each other.

6. The carrier transfer facilitating device according to claim 5,
   wherein a height of a bottom surface of the carrier when lifted by the carrier transferring carriage is lower than a height of an upper surface of the carrier when placed on the carrier table or the temporary table.

7. The carrier transfer facilitating device according to claim 1, wherein the supporting member includes,
   a traveling rail extending in a horizontal direction on which the carrier transferring carriage travels,
   at least two leg members extending downward from the traveling rail, and
   a caster mounted at the lower end of each of the leg members such that the carrier transfer facilitating device is movable on a floor.

8. The carrier transfer facilitating device according to claim 1, further comprising:
   an area sensor configured to detect a person in an area in which the carrier transferring carriage moves, wherein the carriage controller prohibits the carrier transferring carriage from moving when the area sensor detects the person in the area.

9. A carrier transfer facilitating device adapted for a plurality of load ports having respective carrier tables to place thereon a carrier to be transported by a common carrier transporting mechanism that travels along a track, the device comprising:
   at least one temporary table to temporarily place the carrier thereon, the at least one temporary table located directly below the track and without overlapping the carrier tables in a vertical direction;
   a carrier transferring carriage configured to transfer the carrier between the respective carrier tables and the at least one temporary table, the carrier transferring carriage travelling in a horizontal direction above the respective carrier tables and the at least one temporary table and lifting up and down the carrier from and onto the at least one temporary table and the respective carrier tables;
   a supporting member configured to support the at least one temporary table and the carrier transferring carriage; and
   a carriage controller configured to control the carrier transferring carriage such that a position of the carrier transferring carriage does not interfere with the carrier when the carrier is transferred between the respective carrier tables or the at least one temporary table and the common carrier transporting mechanism,
   wherein the respective carrier tables are located directly below the track, and
   wherein a height of a bottom surface of the carrier is higher than an upper surface of the carrier transferring carriage when the carrier is held by the carrier transporting mechanism travelling on the track,
   wherein the carrier transferring carriage travels in a horizontal direction on a second track directly above the respective carrier tables and the at least one temporary table.

10. The carrier transfer facilitating device according to claim 9,
    wherein the at least one temporary table is provided for each of the plurality of load ports, each of the at least one temporary tables being arranged adjacent to a corresponding one of the carrier tables, respectively.

11. The carrier transfer facilitating device according to claim 9,
    wherein the common carrier transporting mechanism horizontally transports the carrier only in one direction, and the at least one temporary table is located downstream of a most downstream one of the respective carrier tables with respect to the one direction of transporting the carrier.

12. The carrier transfer facilitating device according to claim 9,
wherein a height of a bottom surface of the carrier when lifted by the carrier transferring carriage is higher than a height of an upper surface of the carrier when placed on the respective carrier tables or the at least one temporary table.

* * * * *